US007459384B2

(12) United States Patent
Agnello et al.

(10) Patent No.: US 7,459,384 B2
(45) Date of Patent: Dec. 2, 2008

(54) PREVENTING CAVITATION IN HIGH ASPECT RATIO DIELECTRIC REGIONS OF SEMICONDUCTOR DEVICE

(75) Inventors: Paul D. Agnello, Wappingers Falls, NY (US); Rajeev Malik, Pleasantville, NY (US); K. Paul Muller, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 16 days.

(21) Appl. No.: 10/710,227

(22) Filed: Jun. 28, 2004

(65) Prior Publication Data

US 2005/0287798 A1    Dec. 29, 2005

(51) Int. Cl.
*H01L 21/4763* (2006.01)
*H01L 21/3205* (2006.01)
(52) U.S. Cl. .................. 438/595; 438/639; 438/640; 438/643
(58) Field of Classification Search ........... 438/783, 438/758, 761, 763, 778, 303, 675
See application file for complete search history.

(56) References Cited

U.S. PATENT DOCUMENTS

| 6,228,731 | B1 * | 5/2001 | Liaw et al. | 438/303 |
|---|---|---|---|---|
| 6,369,430 | B1 * | 4/2002 | Adetutu et al. | 257/382 |
| 6,500,771 | B1 * | 12/2002 | Vassiliev et al. | 438/783 |
| 6,613,657 | B1 * | 9/2003 | Ngo et al. | 438/588 |
| 6,649,500 | B2 * | 11/2003 | Koga | 438/585 |
| 6,774,441 | B2 * | 8/2004 | Maki et al. | 257/384 |
| 2004/0061169 | A1 * | 4/2004 | Leam et al. | 257/315 |
| 2005/0051833 | A1 * | 3/2005 | Wang et al. | 257/315 |

* cited by examiner

*Primary Examiner*—Zandra Smith
*Assistant Examiner*—Khanh B Duong
(74) *Attorney, Agent, or Firm*—Lisa J. Urich; Hoffman Warnick LLC

(57) ABSTRACT

Methods for preventing cavitation in high aspect ratio dielectric regions in a semiconductor device, and the device so formed, are disclosed. The invention includes depositing a first dielectric in the high aspect ratio dielectric region between a pair of structures, and then removing the first dielectric to form a bearing surface adjacent each structure. The bearing surface prevents cavitation of the interlayer dielectric that subsequently fills the high aspect ratio region.

15 Claims, 5 Drawing Sheets

PREVENTING CAVITATION IN HIGH ASPECT RATIO DIELECTRIC REGIONS OF SEMICONDUCTOR DEVICE

BACKGROUND OF INVENTION

1. Technical Field

The present invention relates generally to semiconductor processing, and more particularly, to methods and structure for preventing cavitation in high aspect ratio regions of a semiconductor device.

2. Related Art

In semiconductor processing, contact shorts have a tendency of occurring where the dielectric films for these levels have to fill high aspect ratio regions or reentrant profile regions. For example, FIG. 1 illustrates a high aspect ratio region 10 formed next to a silicon nitride barrier layer 12 covering two adjacent gates 14 in a semiconductor device. As illustrated, an interlayer dielectric (ILD) layer film 16 placed in high aspect ratio region 10 tends to cause cavitation, i.e., form a keyhole-shaped void or weak spot 20 (hereinafter "void") in the region. Void 20 extends into and out of the page. In particular, during prior processing, oxide under each spacer 22 formed on adjacent gates 14, are undercut 24 during formation of a silicide portion 26 such that deposition of silicon nitride barrier layer 12, especially at lower temperatures, forms a lower portion 30 above undercut 24. As a result of this situation, high aspect ratio region 10 formed between portions of silicon nitride layer 12 has a constrictive region 28 that is smaller than lower portion 30 of high aspect ratio region 10. Constrictive region 28 may also exist even where undercuts 24 are not present. When ILD layer 16 is deposited, it is incapable of completely filling the area in the constrictive region 28 and/or the area just below constrictive region 28, i.e., lower portion 30, resulting in void 20. During subsequent processing, such as clean processing of silicide portion 26, void 20 can be opened or enlarged. When the subsequent metal layers (not shown) are formed, the opened void is filled with metal, leading to a short. Currently, there is no adequate method of addressing these high aspect ratio region voids.

In view of the foregoing, there is a need in the art for prevention of cavitation in high aspect ratio dielectric regions that lead to contact shorts.

SUMMARY OF INVENTION

The invention includes methods for preventing cavitation in high aspect ratio dielectric regions in a semiconductor device, and the device so formed. The invention includes depositing a first dielectric in the high aspect ratio dielectric region between a pair of structures, and then removing the first dielectric to form a bearing surface adjacent each structure. The bearing surface prevents cavitation of the interlayer dielectric that subsequently fills the high aspect ratio region.

A first aspect of the invention is directed to a method of preventing interlayer dielectric cavitation between a pair of structures having a high aspect ratio region therebetween in a semiconductor device, the method comprising the steps of: depositing a first dielectric in the high aspect ratio region; removing the first dielectric to form a bearing surface adjacent each structure; and filling the high aspect ratio region with the interlayer dielectric.

A second aspect of the invention is directed to a method for preventing a contact short between a pair of gate structures having a high aspect ratio region therebetween in a semiconductor device, the method comprising the steps of: depositing a first dielectric in the high aspect ratio region; removing the first dielectric to form a bearing surface adjacent each gate structure; filling the high aspect ratio region with an interlayer dielectric that contacts the bearing surface; and forming a contact through the interlayer dielectric between the gate structures.

A third aspect of the invention is directed to a semiconductor device comprising: a first and a second gate structure, each gate structure including a main body and a spacer; a high aspect ratio region, filled with a dielectric, between the first and second gate structure; and a bearing surface adjacent each gate structure within the high aspect ratio region for preventing cavitation of the dielectric in the high aspect ratio region.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein.

DETAILED DESCRIPTION

Figure 1:
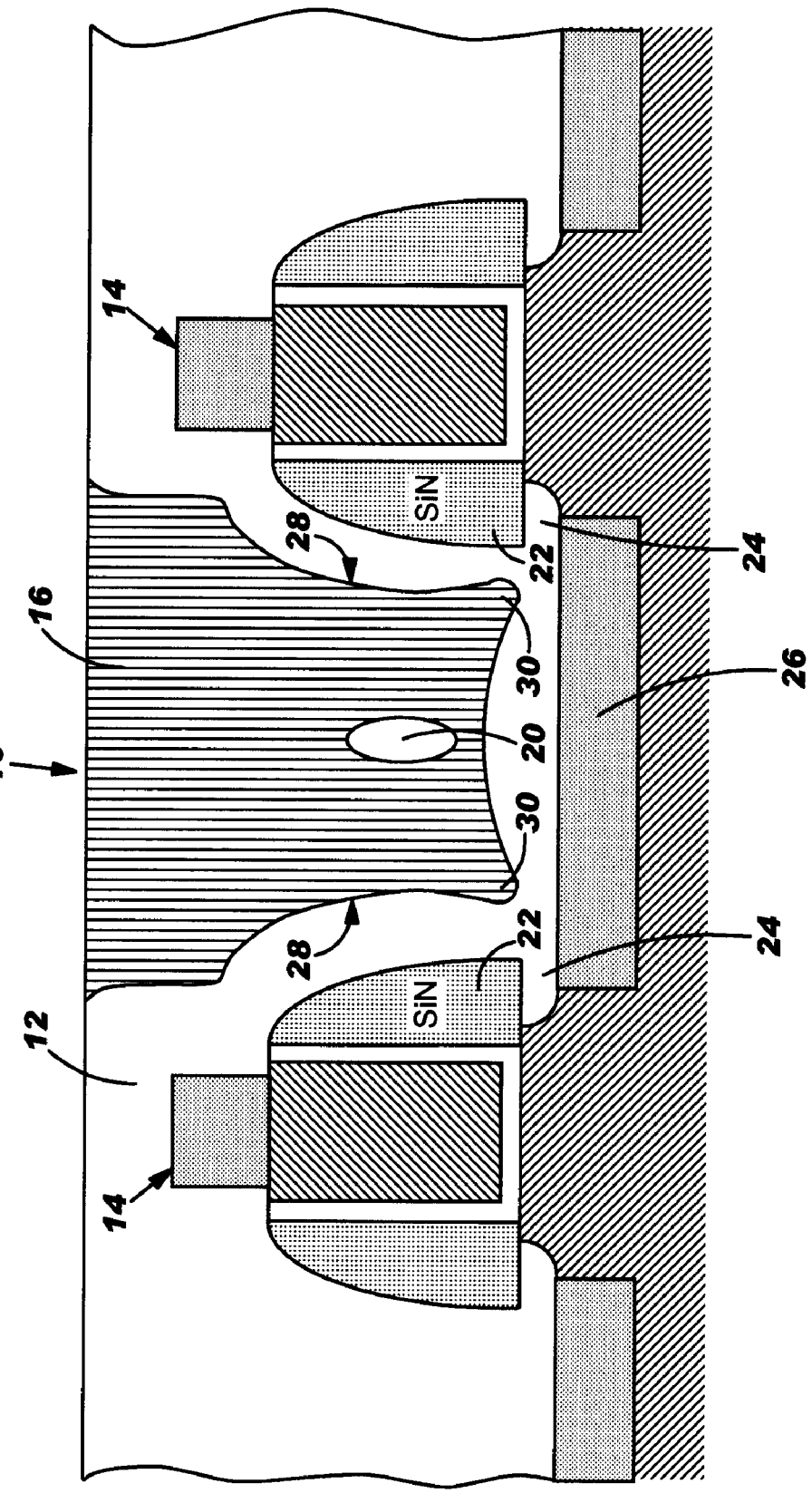
FIG. 1 shows a prior art semiconductor device including a high aspect ratio region void therein.
Figure 2:
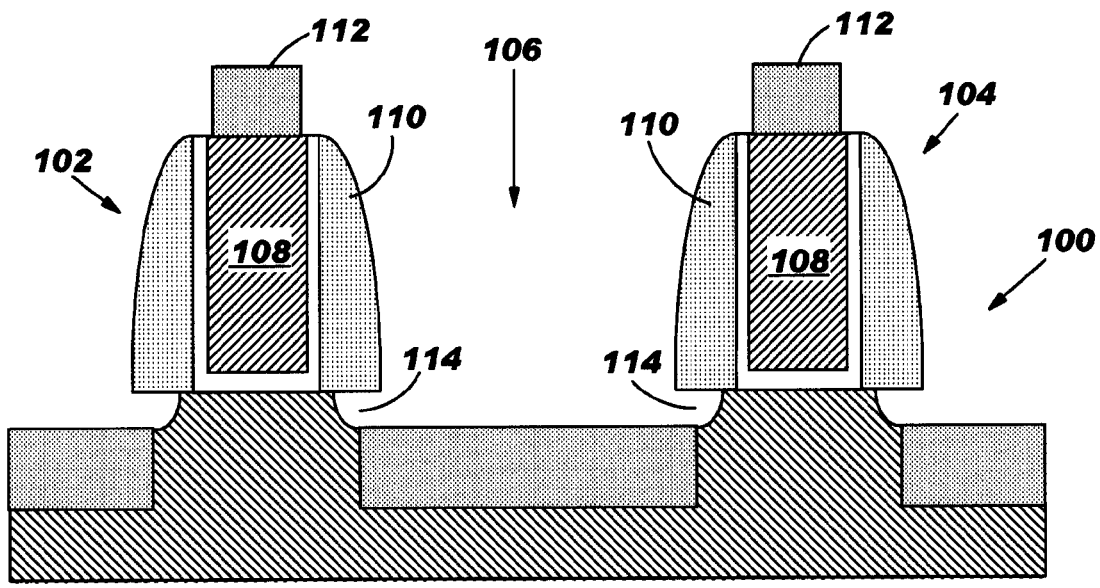
FIG. 2 shows an initial stage of semiconductor fabrication post silicide formation.

With reference to the accompanying drawings, FIG. 2-4, a method of preventing interlayer dielectric cavitation between a pair of structures having a high aspect ratio region therebetween in a semiconductor device will now be described. FIG. 2 shows an initial stage of semiconductor device 100 fabrication in which a first structure 102 and a second feature 104 have been generated with a high aspect ratio region 106 therebetween. For purposes of description, first structure 102 and second structure 104 will be described in terms of gate structures wherein each structure includes a gate having a main body 108, i.e., polysilicon, liner and silicide cap, and a spacer 110 about main body 108. In this example, salicidation processing to form a silicide cap 112 over gate structure(s) has already been completed in which cleaning has formed undercuts 114 under spacers 110. It should be recognized, however, that the invention may be applied to any first and second structure 102, 104 having a high aspect ratio region 106 therebetween. It should also be understood that undercuts 114 are illustrative, and may not be present in all applications of the invention. A "high aspect ratio region" is defined herein as any region having a height-to-width ratio of greater than 1.0.

Figure 3:
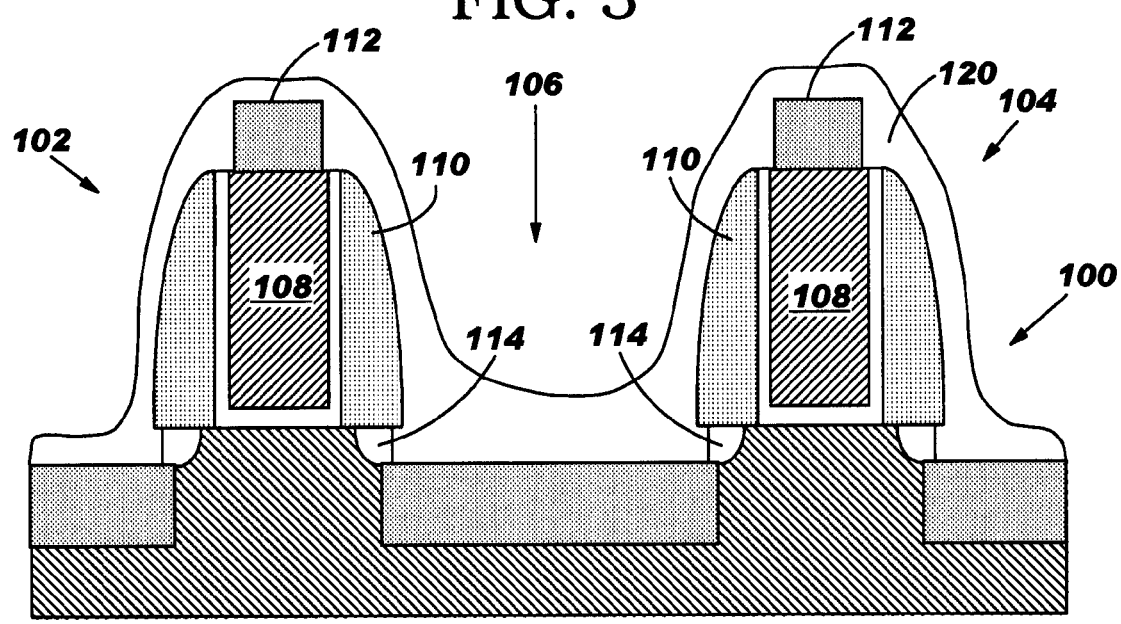
FIG. 3 shows deposition of a first dielectric in accordance with a first embodiment of the invention into a high aspect ratio region.

In a first step of the invention, shown in FIG. 3, a first dielectric 120 is deposited in at least high aspect ratio region 106. In one embodiment, first dielectric 120 is a silicon oxide, which may be deposited as a low temperature oxide to a depth of approximately 200-400 Angstroms (A). However, other materials and deposition mechanisms are possible.

Figure 4:
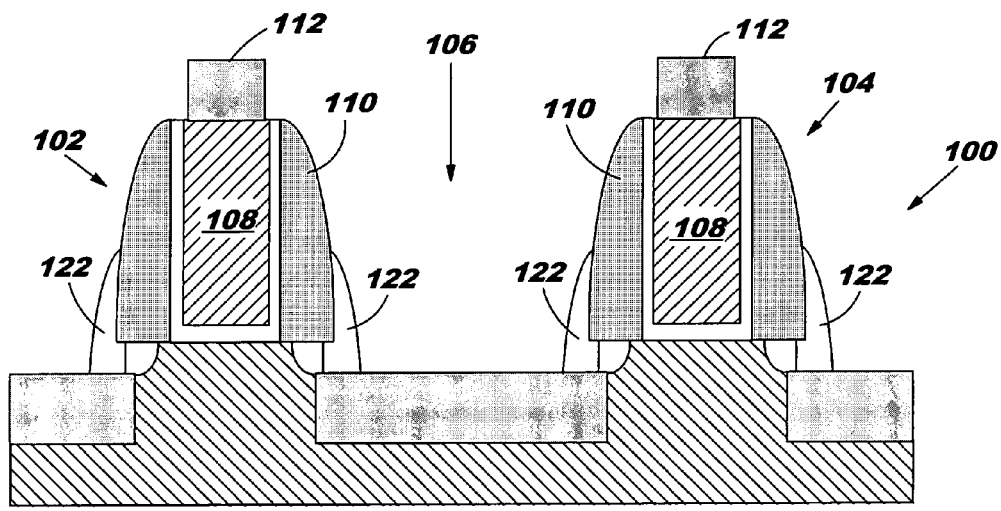
FIG. 4 shows removal of the first dielectric to form bearing surfaces within the high aspect ratio region.

In a next step, shown in FIG. 4, first dielectric 120 is removed to form a bearing surface 122 adjacent each structure 102, 104. As illustrated, bearing surface 122 is substantially triangular in cross-section. In addition, in this embodiment, bearing surface 122 is adjacent spacer 110. In one embodiment, the removing step may include a spacer reactive ion etch (RIE) with overetch. Bearing surface 122 at least partially fills undercuts 114, and forms a surface upon which subsequent layers will bear.

Figure 5A:
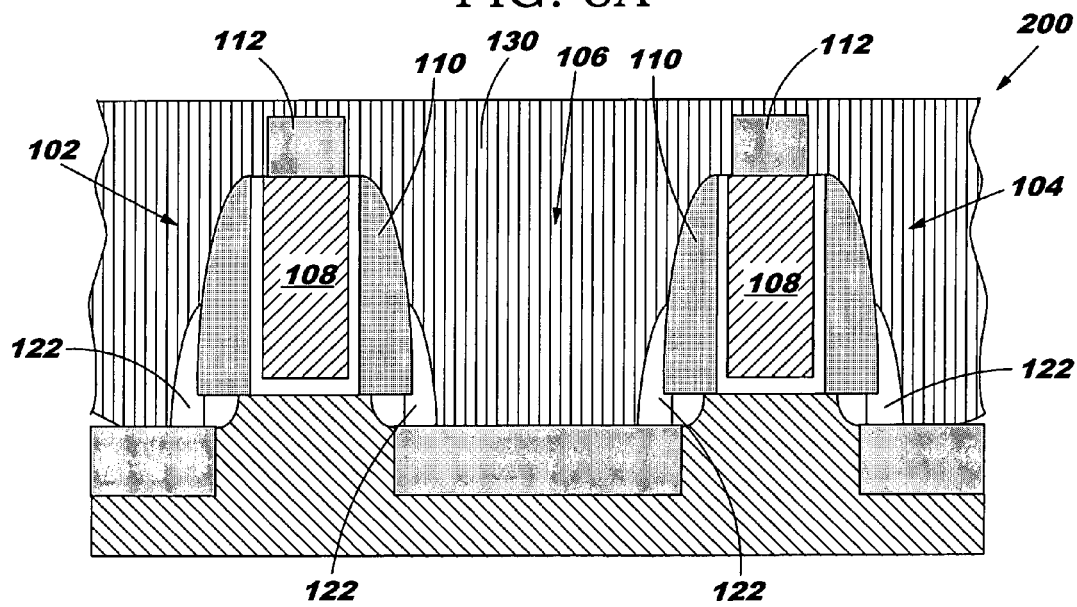
FIG. 5A shows deposition of an interlayer dielectric in the high aspect ratio region.
Figure 5B:
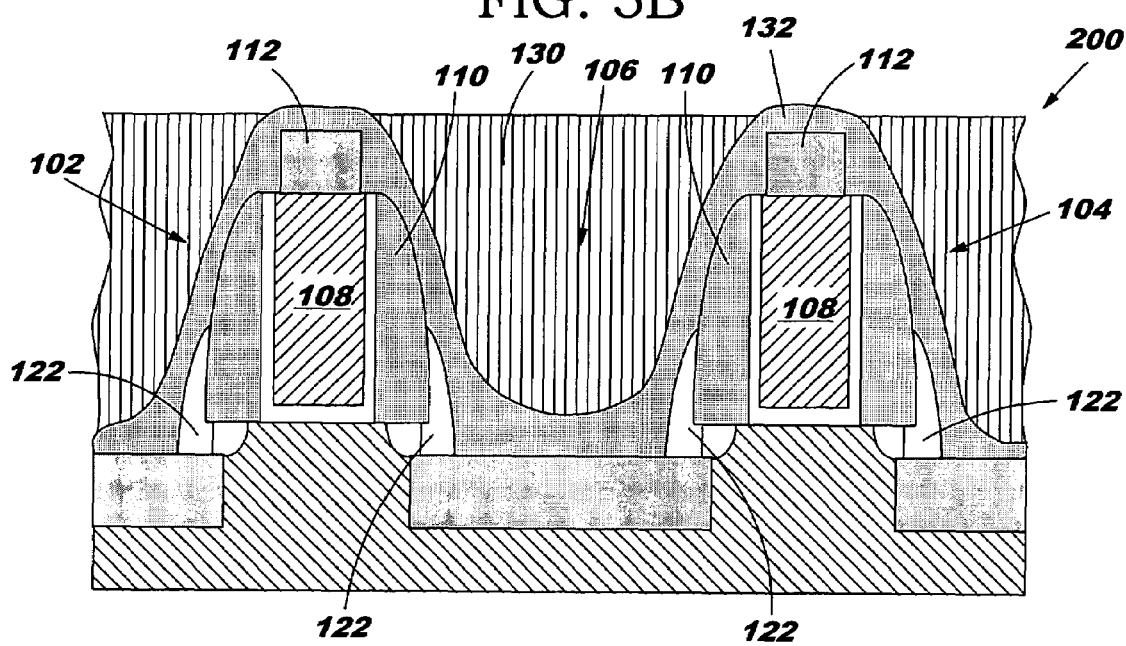
FIG. 5B shows deposition of a barrier layer in the high aspect ratio region prior to the deposition of the interlayer dielectric of FIG. 5A.

In a final step, shown in FIG. 5A, high aspect ratio region 106 is filled with an interlayer dielectric 130 that contacts bearing surface 122. Interlayer dielectric 130 may be any dielectric material commonly used between layers of a semiconductor device, e.g., boro-phosphorous silicate glass (BPSG), undoped silicate glass (USG) or high-density plasma (HDP) oxide. As also shown in FIG. 5B, a barrier layer 132 may deposited prior to deposition of interlayer dielectric 130. Barrier layer 132 may include, for example, silicon nitride deposited by plasma-enhanced chemical vapor deposition (PECVD) to a depth of approximately 200-500 A. In any event, bearing surfaces 122 prevent cavitation in interlayer dielectric 130, which would cause voids or weak spots that may result in a short.

Figure 6:
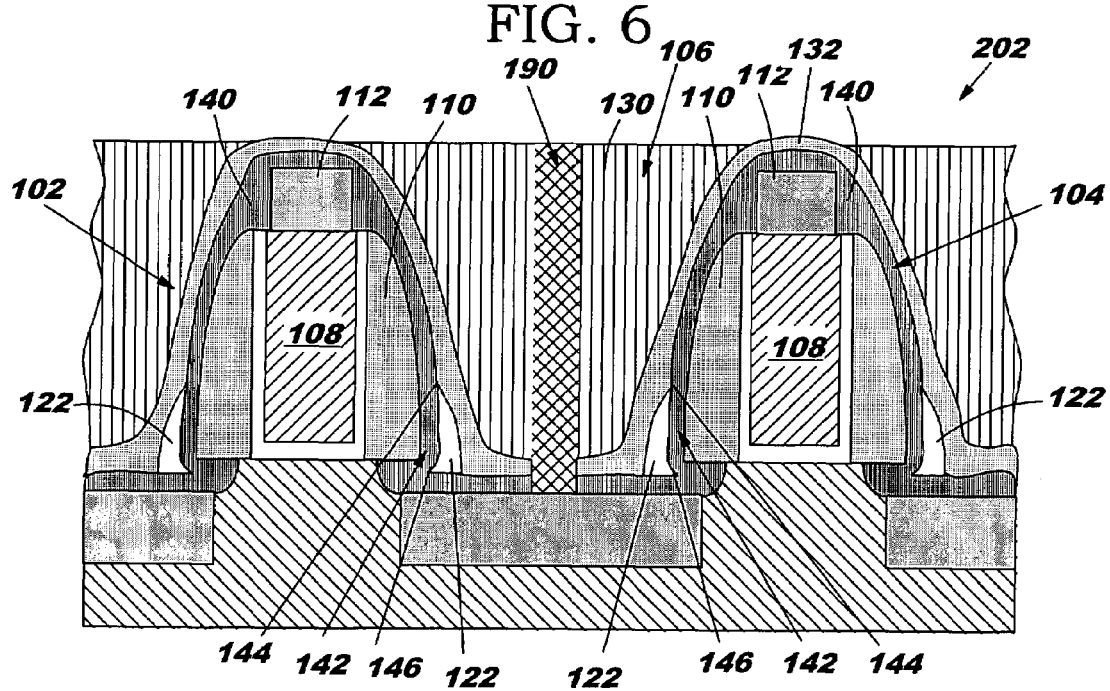
FIG. 6 shows the semiconductor device generated according to a second embodiment of the invention.

Turning to FIG. 6, an alternative embodiment is illustrated in which each structure 102, 104 further includes a cap layer 140 thereover and within high aspect ratio region 106, which is deposited prior to deposition and removal of the first dielectric to form bearing surfaces 122. In this case, bearing surface 122 is adjacent cap layer 140. In addition, in this case, high aspect ratio region 106 includes a constrictive region 142 including a constrictive portion 144 and a lower portion 146 having a dimension greater than constrictive region 144. Bearing surface 122, however, fills lower portion 146 of constrictive region 142 so as to prevent cavitation when interlayer dielectric 130 is deposited.

Subsequent processing may include, as shown in FIG. 6, forming a contact 190 in any now known or later developed fashion through interlayer dielectric 130 between structures 102, 104. Contact 190 may include any metal such as tungsten.

With continuing reference to FIGS. 5 and 6, the above-described methods results in a semiconductor device 200, 202, respectively, comprising: a first 102 and a second 104 gate structure, each gate structure 102, 104 including a main body 108 and a spacer 110; a high aspect ratio region 106, filled with a dielectric 130, between the first and second gate structure 102, 104; and a bearing surface 122 adjacent each gate structure 102, 104 within high aspect ratio region 106 for preventing cavitation of dielectric 130 in high aspect ratio region 106. In one embodiment, shown in FIG. 6, high aspect ratio region 106 includes constrictive region 142 including constrictive portion 144 and lower portion 146 where the lower portion has a dimension greater than the constrictive portion. Bearing surface 122 may be adjacent spacer 110, as shown in FIG. 5, or adjacent cap layer 140, where cap layer 140 is provided over gate structure 102, 104, as shown in FIG. 6. In any event, bearing surface 122 is substantially triangular in cross-section.

Figure 7:
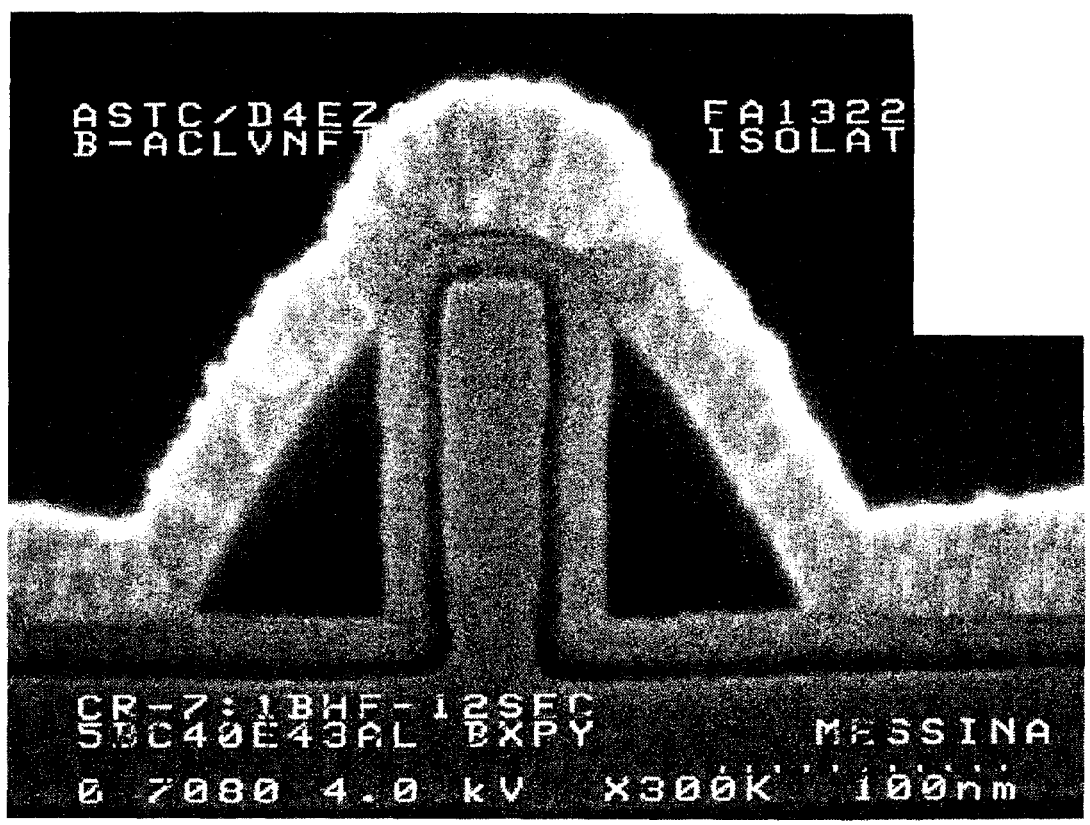
FIG. 7 illustrates an SEM image of the FIG. 5 embodiment.

Referring to FIG. 7, an SEM image of the FIG. 5 embodiment is shown. As illustrated, no cavitation occurs in the high aspect ratio region between the structures.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of preventing interlayer dielectric cavitation between a pair of structures having a high aspect ratio region therebetween in a semiconductor device, the method comprising:

depositing a first dielectric in the high aspect ratio region;

removing the first dielectric to form a bearing surface adjacent each structure, wherein the bearing surface is inclined to a spacer of each structure and extends continuously upwards from a surface coplanar with the base of each structure terminating at a first portion along the height of the spacer of each structure and wherein the remaining first dielectric of the bearing surface partially fills an undercut of each structure;

depositing a barrier layer over each structure including respective bearing surfaces, a second portion along the height of the spacer of each structure, and the high aspect ratio region between the structures; and filling the high aspect ratio region with an interlayer dielectric after the depositing of the barrier layer.

2. The method of claim 1, wherein the high aspect ratio region has a height-to-width ratio of greater than 1.0.

3. The method of claim 1, wherein each structure is a gate including a main body and the spacer about the main body.

4. The method of claim 3, wherein the bearing surface is adjacent the spacer.

5. The method of claim 3, wherein each structure further includes a cap layer thereover and within the high aspect ratio region, wherein the bearing surface is adjacent the cap layer.

6. The method of claim 1, further comprising the step of depositing a cap layer prior to the depositing step.

7. The method of claim 1, wherein the high aspect ratio region includes a constrictive area, and the bearing surface fills an under portion of the constrictive area.

8. The method of claim 1, wherein the bearing surface is substantially triangular in cross-section.

9. A method for preventing a contact short between a pair of gate structures having a high aspect ratio region therebetween in a semiconductor device, the method comprising the steps of:

depositing a first dielectric in the high aspect ratio region;

removing the first dielectric to form a bearing surface adjacent each gate structure, wherein the bearing surface is inclined to a spacer of each gate structure and extends continuously upwards from a surface coplanar with the base of each gate structure terminating at a first portion along the height of the spacer of each gate structure, each gate structure being elevated above a source-drain region of the semiconductor device such that the bearing surface extends vertically beyond the base of each gate structure towards the source-drain region;

depositing a barrier layer over each gate structure including respective bearing surfaces, a second portion along the height of the spacer of each structure, and the high aspect ratio region between the gate structures;

filling the high aspect ratio region with an interlayer dielectric after the depositing of the barrier layer; and forming a contact through the interlayer dielectric between the gate structures wherein the high aspect ratio region includes a constrictive region having a constrictive portion and a lower portion, the lower portion having a substantially horizontal dimension greater than the constrictive portion, and wherein the bearing surface fills the lower portion of the constrictive region.

10. The method of claim 9, wherein each gate structure includes a main body and the spacer about the main body.

11. The method of claim 10, wherein the bearing surface is adjacent the spacer.

12. The method of claim 10, wherein each gate structure further includes a cap layer thereover and within the high aspect ratio region, and wherein the bearing surface is adjacent the cap layer.

13. The method of claim 9, further comprising the step of salicidizing the gate structure prior to the depositing step.

14. The method of claim 13, further comprising the step of depositing a cap layer prior to the depositing step.

15. The method of claim 9, wherein the bearing surface is substantially triangular in cross-section.

* * * * *